(12) United States Patent
Colbert et al.

(10) Patent No.: US 6,792,375 B2
(45) Date of Patent: Sep. 14, 2004

(54) APPARATUS, SYSTEM, AND METHOD OF DETERMINING LOADING CHARACTERISTICS ON AN INTEGRATED CIRCUIT MODULE

(75) Inventors: John Lee Colbert, Byron, MN (US); John Saunders Corbin, Jr., Austin, TX (US); Roger Duane Hamilton, Eyota, MN (US); Arvind Kumar Sinha, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 137 days.

(21) Appl. No.: 10/286,193

(22) Filed: Nov. 1, 2002

(65) Prior Publication Data

US 2004/0088121 A1 May 6, 2004

(51) Int. Cl.[7] ........................... G06F 19/00; G06F 17/50
(52) U.S. Cl. ....................... 702/117; 439/91; 439/591; 714/726; 714/30
(58) Field of Search ........................... 702/117; 439/91, 439/591; 324/755, 754; 714/30, 726; 361/784, 764, 777, 790; 703/14

(56) References Cited

U.S. PATENT DOCUMENTS

| 3,661,013 | A | 5/1972 | Wilson |
|---|---|---|---|
| 3,879,997 | A | 4/1975 | Mann |
| 4,380,171 | A | 4/1983 | Smith |
| 4,483,203 | A | 11/1984 | Capper |
| 5,107,712 | A | 4/1992 | Field et al. |
| 5,574,583 | A | * 11/1996 | Kim .......................... 349/122 |
| 5,748,007 | A | 5/1998 | Gaschke |
| RE36,442 | E | 12/1999 | Kardos |
| 6,209,403 | B1 | 4/2001 | Chen et al. |
| 6,299,456 | B1 | 10/2001 | Wark et al. |
| 6,475,011 | B1 | * 11/2002 | Sinha et al. ................ 439/330 |
| 6,477,058 | B1 | * 11/2002 | Luebs et al. ................ 361/784 |
| 6,634,095 | B2 | * 10/2003 | Colbert et al. ................ 29/740 |

FOREIGN PATENT DOCUMENTS

| DE | 4003552 A1 | 8/1991 |
|---|---|---|
| JP | 59110149 A | 6/1984 |
| JP | 1150829 | 6/1989 |
| JP | 2044223 A | 2/1990 |
| JP | 2110333 A | 4/1990 |
| JP | 3144329 A | 6/1991 |
| JP | 2000284019 A | 10/2000 |

* cited by examiner

Primary Examiner—Kamini Shah
(74) Attorney, Agent, or Firm—Leslie J. Payne

(57) ABSTRACT

A portable testing apparatus operable with a force applying apparatus for testing loading characteristics on an integrated circuit assembly coupled to a circuit board. Included is a housing assembly having a size and shape to simulate an integrated circuit assembly to be tested; a loading element coupled for movement relative to the housing assembly and engageable with a load detecting system for transferring forces thereto in response to forces applied by a force applying apparatus; an interposer which mates the housing assembly to a circuit board; and, a load detecting system associated with the housing assembly for providing signals representative of characteristics of loading forces applied thereto by a force applying apparatus, whereby the load delivery characteristics of a force applying apparatus can be determined. A method of testing is also provided.

22 Claims, 4 Drawing Sheets

APPARATUS, SYSTEM, AND METHOD OF DETERMINING LOADING CHARACTERISTICS ON AN INTEGRATED CIRCUIT MODULE

CROSS REFERENCE TO RELATED PATENT APPLICATION

The present application is related to copending U.S. patent application: Ser. No. 09/948,195, filed on Sep. 7, 2001, entitled "Land Grid Array Socket Actuation Hardware for MCM Applications" which is commonly assigned herewith and incorporated herein by reference.

BACKGROUND OF THE INVENTION

The present invention relates generally to an improved testing apparatus and method for use in diagnostic testing of computer systems and, more particularly, to an improved portable or mobile testing apparatus and method for use during diagnostic field testing of integrated circuitry and connected boards.

With ever increasing demands for miniaturization and higher operating speeds, packaging and reliable interconnects are of increasing importance. The trend in miniaturized electronic packaging is to use area array packages for interconnecting integrated circuit packages with boards. One example is the use of a land-grid array (LGA) that is commonly used in the electronics industry for mounting a single-chip module (SCM) to a number of components. The interconnection of a LGA module to a printed wiring board (PWB) requires the accommodation of a high area density of electronic contacts that result in a reliable electronic connection over a wide range of thermal and dynamic operating environments. For effecting such electrical connections, the LGA module is fabricated by aligning the electrical contacts of the LGA module, interposer, and PWB and mechanically compressing them together. High clamping forces, for example exceeding several hundred pounds, are typically provided by a force applying apparatus or mechanism. An advantage of the LGA module is that it is interchangeable and easily upgraded in the field. More recently, LGA's have been used in combination with multiple-chip modules (MCM's) and PWB's. However, achieving a reliable and uniform connection between the components requires significant alignment and relatively high forces that can prove difficult to implement.

For a variety of reasons often attributable to various temperature and dynamic loading factors experienced in the field, computer hardware occasionally fails despite vigorous debugging during manufacturing of components and their assembly. Clearly, the ensuing downtimes are undesirable in many different respects. It is desirable, therefore, to expeditiously determine their source and make the appropriate fixes inexpensively.

Present day testing of computer systems involve the use of diagnostic devices for locating potential sources of system failure. On occasion, the diagnostic testing determines that a potential source of error is broadly the LGA system or perhaps the possibility that the LGA loading system associated therewith that may have been the cause of failure. For example, if a system fails in the field, diagnoses are undertaken. One of the known tests will determine if there are potential connectivity issues in the LGA system that includes the MCM, interposer, and a PWB; as well as the LGA loading system within the computer system that applies loading to the LGA system. The force applying apparatus is extremely important in terms of achieving the connectivity between the matching contacts existing between the MCM, interposer, and PWB and presently there is no known approach for measuring its performance in terms of applying the requisite forces for establishing the desired connectivity. Heretofore, potential connectivity issues that arise in the field in connection with the LGA system are addressed by shipping the computer system to a testing and repair facility in order to determine which if any components of the LGA system and/or LGA loading system are defective. Clearly, the requirement to ship the computer system back for diagnoses represents a significant expense and leads to significant operational downtimes as well as customer dissatisfaction.

Without the ability to conduct successful on-site diagnoses, the potential for reducing downtime of component failures in computer systems is significantly diminished. This is especially the case when diagnosing problems arising in the field relating to the LGA system and/or its loading system.

SUMMARY OF THE INVENTION

In accordance with the present invention, provision is made for a method of testing loading characteristics on an integrated circuit assembly connected to a circuit board. The method comprises the steps of: providing a simulated integrated circuit assembly for use in performing the loading tests; mating an electrical interposer to and between the integrated circuit assembly and a circuit board; applying loading to the mated simulated integrated circuit assembly and circuit board by a force applying apparatus; and, detecting the applied loading forces on the mated simulated circuit assembly and circuit board for determining loading characteristics of a force applying apparatus.

In yet another illustrated embodiment, provision is made for a portable apparatus operable with a force applying apparatus for testing loading characteristics on an integrated circuit assembly coupled to a circuit board. The apparatus comprising: a housing assembly having a size and shape to simulate an integrated circuit module to be tested; a loading element coupled for movement relative to the housing assembly and engageable with a load detecting system for transferring forces to the system in response to forces applied by a force applying apparatus; an interposer which mates the housing assembly to a circuit board; and, a load detecting system at least partially within the housing assembly for providing signals representative of the loading forces applied thereto by a force applying apparatus so that the load delivery characteristics of a force applying apparatus can be determined.

In still another embodiment of the present invention provision is made for a testing system for use in a computer enclosure of a computer system. The testing system comprises: a portable testing apparatus operable with a force applying apparatus for testing loading characteristics on an integrated circuit assembly coupled to a circuit board in the computer system. The testing apparatus is like that described above.

An aspect of the present invention relates to a low-cost testing apparatus and method for use in performing field-testing of electrical interconnections between integrated circuit assemblies and associated circuit boards.

An aspect of the present invention is that it, preferably, allows for field-testing of components in a computer system that heretofore had to be transported from the site for completing testing of defective components.

Another aspect of the present invention relates to a portable or mobile testing apparatus for use in performing field-testing of electrical interconnections between integrated circuit assemblies and printed circuit boards.

A still further aspect of this invention is that it improves a testing process for decreasing the downtime associated with a malfunction of a computer system.

A still further aspect of the present invention is to improve the reliability of finding defects in a LGA system in a computer system.

A still further aspect of this invention is to provide an apparatus which can be used in the field for testing for potential electrical interconnection failures in a LGA system.

Another aspect of the present invention is to allow for the expeditious testing of LGA system including a multiple-chip module (MCM) and a PWB.

A still further aspect of this invention is to allow testing of the force applying system for a LGA system without its removal from the computer system.

A still further aspect of this invention is to provide a cost effective, portable apparatus for debugging system hardware in the field.

DETAILED DESCRIPTION

Figure 1:
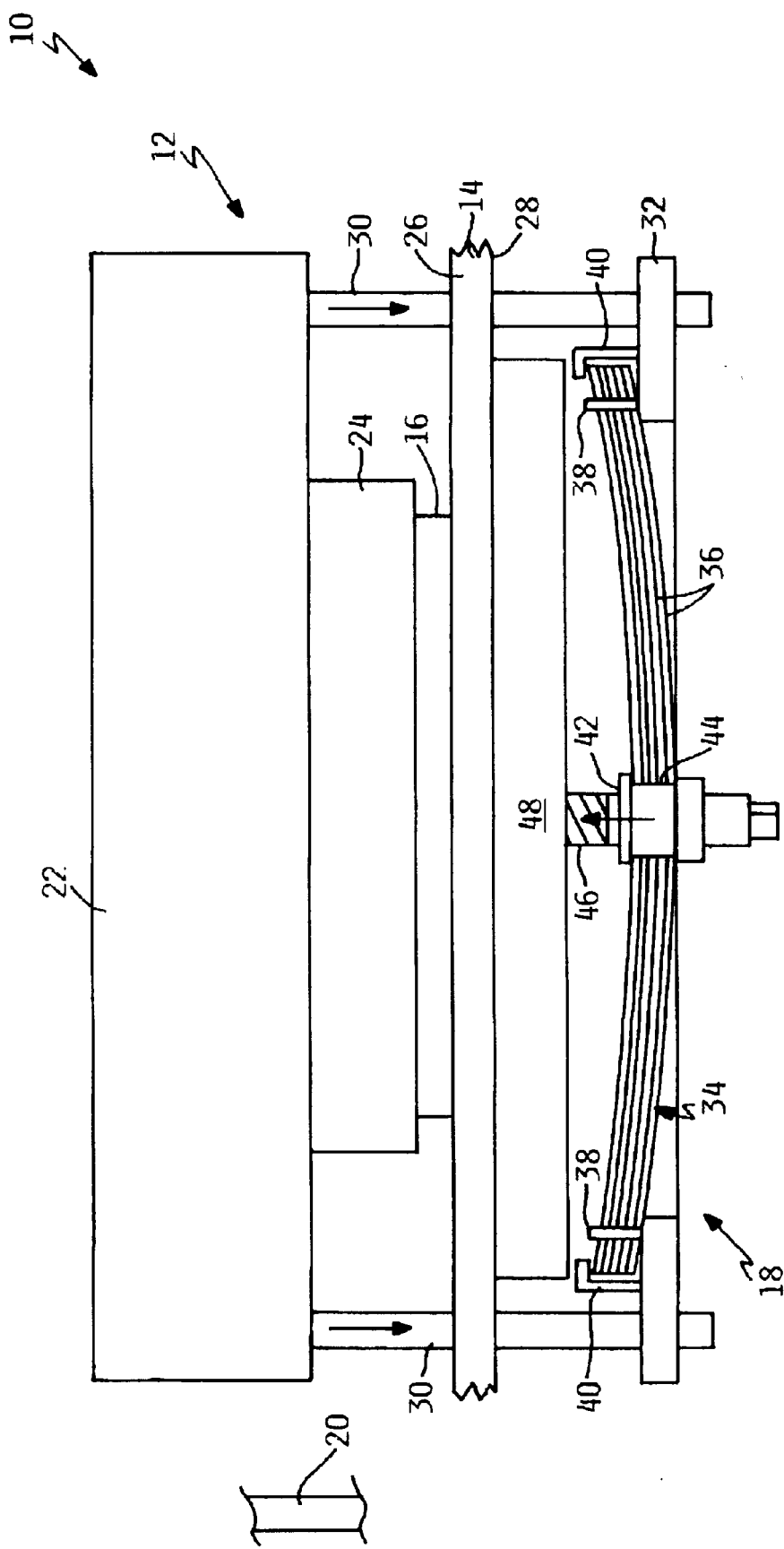
FIG. 1 is an elevation view of a multi-chip module and interposer coupled to a printed wiring board and installed in a force applying apparatus.
Figure 2:
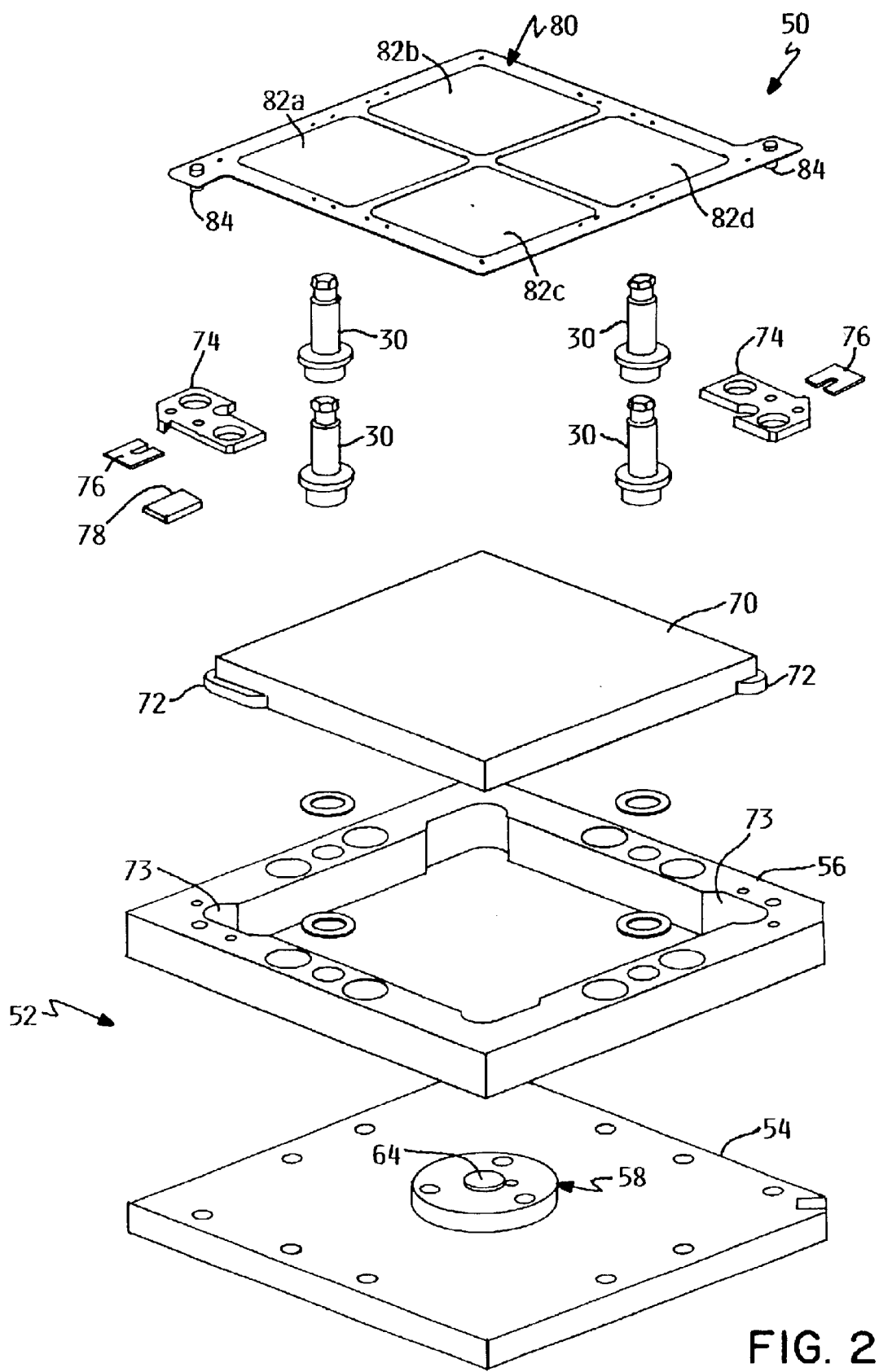
FIG. 2 is an exploded perspective view of a portable testing apparatus or module of the present invention.
Figure 3:
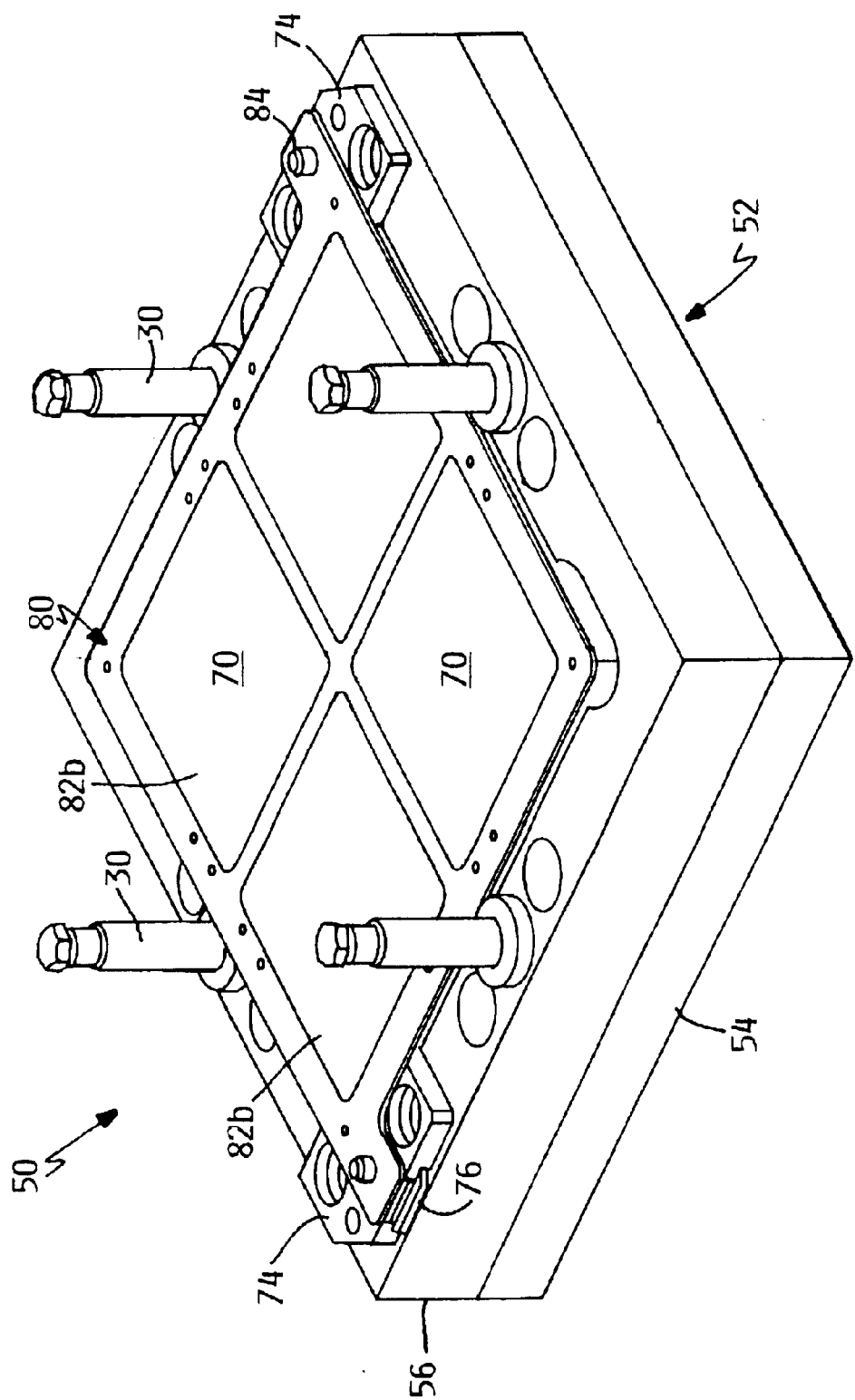
FIG. 3 is a perspective view of a portable testing apparatus or module of the present invention shown in an assembled mode of operation.
Figure 4:
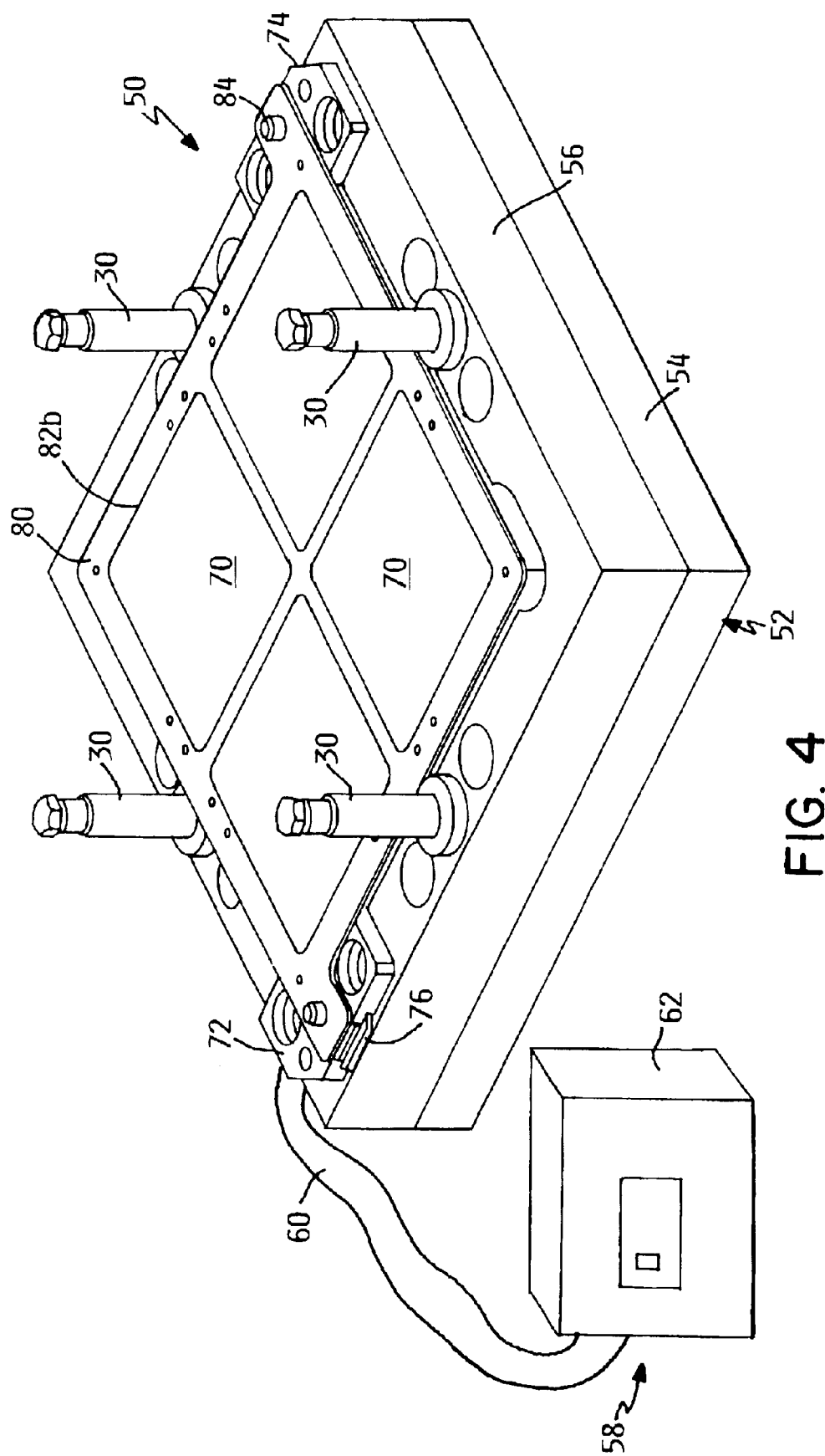
FIG. 4 is a perspective view similar to FIG. 3, illustrating the portable testing apparatus with an electronic read-out device.

Referring to FIG. 1, a land-grid array (LGA) system 10 is illustrated that is particularly adapted for use in joining a multi-chip module (MCM) assembly 12 to a printed wiring board (PWB) 14 through a LGA electrical interposer 16 by means of a LGA force applying or loading apparatus 18 located within, for example, a computer system generally designated by reference numeral 20. FIGS. 2–4 illustrate one preferred embodiment of a mobile or portable electronic testing apparatus 30 of the present invention that is particularly adapted for use in testing loading characteristics on an integrated circuit assembly connected to a circuit board, whereby the functional reliability of the integrated circuit assembly and the loading apparatus can be determined in accordance with the process of this invention.

Reference is made back to FIG. 1, wherein the land-grid array system 10 and the associated LGA loading apparatus 18 are housed in an area or pocket in a global stiffener (not shown) between the system backplane and a power distribution board (not shown) within an enclosure of a computer system 20. In this embodiment, the land-grid array system 10, the LGA loading apparatus 18 and the computer system can be of the type available in, for example, an IBM eServer iSeries computer system commercially available from International Business Machines Corporation, Armonk, N.Y. It will, however, be appreciated that the principles of the present invention envision a mobile electronic testing apparatus that can be used in a variety of different field testing situations involving electrical connectivity between a printed board and an integrated circuit module or assembly, wherein the connectivity is effected by a force applying apparatus applying forces to the board and circuit module.

With continued reference to FIG. 1, it will be understood that the land-grid array system is similar to that described in Ser. No. 09/948,195, filed on Sep. 7, 2001, entitled "Land Grid Array Socket Actuation Hardware for MCM Applications". Only those details thereof necessary for understanding this invention will be set forth. The multi-chip module assembly 12 includes a housing assembly 22 and a substrate portion 24 housing the multiple chips (not shown). The substrate portion 24 is electrically mated to the PWB 14 through the use of the interposer 16. The LGA interposer 16 provides appropriate electrical connectivity between the aligned electrical contacts (not shown) of the substrate portion 24 and the electrical contacts (not shown) of the printed wiring board 14. The printed wiring board 14 has an upper surface 26 and a lower surface 28. The electrical interposer 16 is positioned upon the upper surface and is aligned with the electrical contacts of the printed wiring board. A plurality of loading posts 30 of the multi-chip assembly are in threaded engagement with the housing assembly 22 and pass through aligned openings in the printed wiring board 14 for fixed engagement with a load transfer element or plate 32 positioned below (as viewed in the drawings) the printed wiring board.

For applying the loading forces for effecting the desired electrical connectivity, a spring assembly 34 is provided in combination with the load transfer plate 32. The load transfer plate 32 supports the spring assembly 34 used to apply force to the multi-chip module assembly 12, the interposer 16 and the printed wiring board 14. In this embodiment, the spring assembly 34 includes a stack of deflectable spring plates 36 positioned upon the upper surface of the load transfer plate 32 over alignment pins 38 and is held in place by retention clips 40. The load transfer plate 32 has a center opening such that only the edges of the spring assembly are supported thereof.

A spring actuator assembly 42 includes a bushing 44 and a spring actuation screw 46. The bushing 44 is placed in an opening at the center of the spring plates 36 and is internally threaded. The spring actuation screw 46 has complementary external threads and is positioned within the bushing 44. A backside stiffener plate 48 is also positioned upon the lower surface 28 of the printed wiring board 14. The spring actuation screw 46 is threaded into the bushing 44 until the end of the actuation screw contacts the backside stiffener plate 48. As the actuation screw 46 is further threaded into the bushing 44, the backside stiffener plate 48 is compressed against the lower surface 28 of the printed wiring board 14 as the center portion of the spring assembly 34 deflects downward. The edges of the spring assembly 34 are supported by the upper surface of the load transfer plate 32, and restrained by the alignment pins 38 and retention clips 40. When the actuation screw 46 is tightened, the center portion of the spring assembly 34 deflects downward into the center opening of the load transfer plate 32. As the center of the spring assembly 34 deflects downward, a downward force is applied to the load transfer plate 32 where the edges of spring assembly are supported by an upper surface of the load transfer plate. As the load transfer plate 32 is supported by the load transfer posts 30, the downward force applied to the load transfer plate generates a tensile force in the load transfer posts. On the opposite end of the load transfer posts 30, the tensile force pulls downward upon the multi-chip module assembly 12. This downward force imparted upon the multi-chip module assembly 12 compresses the substrate portion 24 and interposer 16 between the module assembly 12 and the upper surface 26 of the printed wiring board 14. In this manner, the substrate portion 24 and the interposer 16 are restrained upon the printed wiring board 14 in proper alignment, thereby ensuring electrical contact between the components over a broad range of thermal and dynamic operating environments.

Advantages of the foregoing construction include predictable and evenly applied loading to the multi-chip assembly, interposer and printed wiring board so as to compress the foregoing for effecting electrical connections therebetween of the desired integrity.

Reference is now made to FIGS. 2–4 for illustrating one preferred embodiment of the improved portable or mobile electronic diagnostic testing module or apparatus 50 for purposes of carrying out the process of determining functional operating characteristics of a force applying apparatus 18. In this embodiment, the majority of elements forming the diagnostic testing apparatus 50 have generally the same generally quadrilateral shape. Clearly, the present invention envisions other geometric shapes and sizes.

The testing apparatus 50 includes a housing assembly 52 that simulates an integrated circuit assembly, such as a MCM. It will be appreciated that the testing apparatus 50 is to replace an installed MCM assembly 12 and LGA interposer 16, that is illustrated in FIG. 1, in the field to provide for on-site testing of components or subsystems of the computer system.

Included in the housing assembly 52 are a base member 54 and an associated spacer plate or element 56 that is affixed to the base member by any suitable means. Both the base member and the spacer element can be made of stainless steel or other similar materials so as to sustain the intense loading to be experienced. In this embodiment, the spacer element defines a well space 57 for receiving a portion of a load detecting system 58.

The load detecting system 58 is operable for providing signals representative of the characteristics of loading forces applied thereto by the force applying apparatus 18. The load detecting system 58 is coupled electrically as by leads 60 through a slotted feature (not shown) to a processing and display device 62; see FIG. 4. The processing and display device 62 is of a type that is commercially available. The load detecting system 58 should have suitable DC characteristics for measuring static load and for measuring load degradation over time. Other similar kinds of processing and display systems can be used. In this embodiment, the load detecting system 58 includes a single load cell 64 that is centered on the base member 54. While a single load cell is illustrated and described, it will be appreciated that a plurality of load cells can be used in a known manner, such as a triad of load cells (not shown) that are circularly and equally spaced with respect to each other. The load cell 64 allows the total load developed by the LGA force applying apparatus or hardware to be measured and displayed. Referring back to the spacer element 56, it includes internally threaded mounting openings for receiving one end of the corresponding loading posts 30 which posts are used to transmit the load developed by the MCM force applying apparatus 18. Also in a known manner, the load on each of the loading posts 30 can be determined and displayed.

FIG. 2 illustrates a loading element or plate 70 that is sized and shaped to vertically move or float within the well space 57 for purposes of transferring the load applied by the LGA force applying apparatus 18 to the load cell 64. The loading plate 70 is made of stainless steel or other suitable material and has a generally smooth and planar surface for purposes of simulating the glass substrate of the multi-module assembly substrate that it is intended to replace for testing purposes. The loading plate 70 has a pair of ledges 72 at diametrically opposing corners as illustrated, which are guided by complementary shaped guiding recesses 73, formed at diametrically opposing ends of the spacer plate for guiding movement of the loading element or plate. An L-shaped bracket 74 and clip 76 that are typically associated with a MCM assembly are secured to the marginal upper surface of the illustrated corners of the spacer block located adjacent the guiding recesses 73. The bracket and clip combination serve to limit vertical movement of the loading plate 70 within the well space. Interconnected between the clip and bracket is a flexibly resilient pad 78 (one of which is shown) that serves to bias the loading plate 70 into engagement with the load cell 64. Other biasing approaches for the loading plate are clearly contemplated by the present invention.

The present invention also includes an electrical interposer frame 80 that is to simulate an interposer frame that actually connects a printed wiring board to an integrated circuit package, such as a MCM assembly. The simulated interposer frame 80 serves to distribute the load in a manner equivalent to that by an interposer frame in an actual installation. In addition, the interposer frame protects the contact areas of printed wiring board 14 from damage. While the interposer frame 80 in this embodiment will not electrically interconnect a MCM substrate to a PWB, the interposer frame 80 can nevertheless be similar to that described in the last noted corresponding patent application; since it will serve to simulate such an interconnection. Accordingly, only those aspects of the interposer frame 80 necessary to understand the present invention will be presented. In this embodiment, the electrical interposer frame 80 has a quadrilateral shape including a plurality of cut-outs 82a–d and a pair of locator pins 84. The cut-outs 82 a–d are where the actual LGA contacts would reside and facilitate the interposer frame 80 defining a backplane. It will be appreciated that the electrical interposer frame 80 can have a variety of configurations and can be made of a variety of suitable materials.

In accordance with the present invention, the testing apparatus 50 can be used for determining the functional integrity of a force applying apparatus in a computer system as well the associated MCM assembly. If a diagnostic test of a failed computer system is performed and it is determined that electrical connectivity of the MCM assembly and the printed wiring board is a potential source of problems, the present testing apparatus can be used. In this regard, a method according to the present invention comprises the steps of: replacing an MCM assembly with the testing apparatus 50. In this regard, an installed interposer is replaced with the simulated interposer 80 so as to mate the MCM assembly with an installed printed wiring board 14. As a consequence, the simulated interposer and MCM assembly are placed in mating engagement with the printed wiring board and the load stiffener plate. Thereafter, a load is applied by the LGA loading apparatus to the loading plate which is transferred to the load cell. Depending on the testing mode of the load detecting system, a readout will be provided. For instance, if the total load applied is outside the desired loading parameters which are normally associated with effecting a reliable connection, such a result would be indicative of a defective loading apparatus. Accordingly, such a loading apparatus should be replaced in order for effecting the desired loading that would be necessary for effecting the desired electrical connections between the printed wiring board and the MCM assembly. Additional testing can be conducted whereby the load on each of the loading posts can be determined for attempting to localize areas of potential defects. Should the LGA loading apparatus perform in its intended manner, a user in the field can then inspect the actual MCM assembly and interposer to determine, preferably, visually whether of not they are the cause of failure.

The embodiments and examples set forth herein were presented to best explain the present invention and its practical applications and to thereby enable those skilled in the art to make and use the invention. However, those skilled in the art will recognize that the foregoing description and examples have been presented for the purposes of illustration and example only. The description set forth is not intended to be exhaustive or to limit the invention to the precise forms disclosed. Many modifications and variations are possible in light of the above teachings without departing from the spirit and scope of the appended claims.

What is claimed is:

1. A method of testing loading characteristics on an integrated circuit assembly connected to a circuit board; the method comprising the steps of:
   providing a simulated integrated circuit assembly for use in performing the loading tests;
   mating an electrical interposer to and between the integrated circuit assembly and a circuit board;
   applying loading to the mated simulated integrated circuit assembly by a force applying apparatus; and,
   detecting the applied loading forces on the mated simulated circuit assembly and circuit board for determining loading characteristics of a force applying apparatus.

2. The method of claim 1 wherein the step of providing a simulated integrated circuit assembly includes a preliminary step of replacing an actually installed integrated circuit assembly in a computer system with the simulated integrated circuit assembly.

3. The method of claim 2 wherein the step of applying loading includes using a force applying apparatus in the computer system.

4. The method of claim 2 wherein the step of providing an electrical interposer includes providing a simulated interposer to replace an actually installed interposer so as to distribute the load in a manner similar to the actually installed interposer.

5. The method of claim 1 wherein the step of detecting the applied loading characteristics is achieved by providing at least one load cell assembly within the simulated integrated circuit assembly, whereby load delivery characteristics of the force applying apparatus can be determined.

6. The method of claim 5 wherein the step of detecting includes the step of providing a readout of the applied loading forces.

7. The method of claim 6 wherein the step of providing the integrated circuit assembly includes providing a multi-chip module.

8. The method of claim 7 the step of providing the circuit board includes providing a printed wiring board.

9. A portable testing apparatus operable with a force applying apparatus for testing loading characteristics on an integrated circuit assembly coupled to a circuit board; the apparatus comprising:
   a housing assembly having a size and shape to simulate an integrated circuit module to be tested;
   a loading element coupled to the housing assembly for movement relative to the housing assembly and engageable with a load detecting system for transferring forces to the system in response to forces applied by a force applying apparatus;
   an interposer which mates the housing assembly to a circuit board; and,
   a load detecting system at least partially within the housing assembly for providing signals representative of the loading forces applied thereto by a force applying apparatus so that the load delivery characteristics of a force applying apparatus can be determined.

10. The testing apparatus of claim 9 wherein the housing assembly simulates a multi-chip module assembly.

11. The testing apparatus of claim 9 wherein the loading element has surface characteristics simulating a glass substrate of a multi-chip module assembly.

12. The testing apparatus of claim 9 wherein the housing assembly includes a base and a spacer element that is attached to the base and defines a well area into which a portion of the load detecting system resides.

13. The testing apparatus of claim 12 wherein the load detecting system includes at least one load cell which provides a readout of the applied forces.

14. The testing apparatus of claim 11 wherein the loading element is biased into engagement with a biasing device.

15. The testing apparatus of claim 11 wherein the biasing device includes at least a resiliently flexible member.

16. The testing apparatus of claim 12 wherein the housing assembly includes a plurality of loading posts extending therefrom for engagement with the force applying apparatus.

17. The testing apparatus of claim 16 wherein a plurality of pairs of a bracket and clip is associated with the interposer for locating and retaining the interposer.

18. A computer system comprising:
   a computer enclosure;
   a testing system for use in the computer enclosure;
   the testing system comprises:
      a testing apparatus operable with a force applying apparatus in the enclosure for testing loading characteristics on an integrated circuit assembly coupled to a circuit board;
   the testing apparatus comprising:
      a housing assembly having a size and shape to simulate an integrated circuit module to be tested;
      a loading element coupled for movement relative to the housing assembly and engageable with a load detecting system for transferring forces thereto in response to forces applied by a force applying apparatus;
      an interposer which mates the housing assembly to a circuit board; and,
      a load detecting system at least partially within the housing assembly for providing signals representative of characteristics of loading forces applied thereto by a force applying apparatus; and,
   a force applying apparatus for applying forces to the loading element which is engageable with the load detecting system for providing a signal representative of the loading forces applied by a force applying apparatus so that the load delivery characteristics of the force applying apparatus can be determined.

19. The computer system of claim 18, wherein the circuit board is a printed wiring board.

20. The computer system of claim 19, wherein the integrated circuit module is a multi-chip module.

21. A method of field testing a computer system to determine integrity of connections between an integrated circuit module and a circuit board as well as a force applying apparatus, the method comprising the steps of:

replacing an installed integrated circuit module with a simulated integrated circuit module;

replacing an installed interposer with a simulated interposer so as to mate the simulated interposer with a circuit board;

the simulated integrated circuit module replacing step including providing a load detecting system at least partially within the simulated module for providing output signals representative of characteristics of loading forces applied thereto by a force applying apparatus so that the load delivery characteristics of the force applying apparatus can be determined; and, applying a loading force to the simulated module by the force applying apparatus so that the detecting system provides an output representative of the load delivery characteristics of the force applying apparatus, whereby a determination can be made of the load delivery characteristics of the force applying apparatus.

22. The method of claim 21 further comprising the step of: inspecting the replaced module and interposer to determine if either has failed.

* * * * *